United States Patent
Ichino et al.

[11] Patent Number: 6,155,724
[45] Date of Patent: Dec. 5, 2000

[54] LIGHT TRANSMITTING MODULE FOR OPTICAL COMMUNICATION AND LIGHT TRANSMITTING UNIT THEREOF

[75] Inventors: Haruhiko Ichino; Masaki Hirose, both of Shinjuku-ku; Yoshihisa Warashina, Hamamatsu; Mikio Kyomasu, Okaya, all of Japan

[73] Assignees: Hamamatsu Photonics KK, Shizuoka-ken; Nippon Telegraph and Telephone Corporation, Tokyo, both of Japan

[21] Appl. No.: 09/034,348

[22] Filed: Mar. 4, 1998

[30] Foreign Application Priority Data

| Mar. 4, 1997 | [JP] | Japan | 9-048798 |
| Mar. 4, 1997 | [JP] | Japan | 9-048799 |
| Apr. 3, 1997 | [JP] | Japan | 9-048800 |

[51] Int. Cl.[7] ........................ G02B 6/24
[52] U.S. Cl. ............... 385/92; 385/88; 385/94
[58] Field of Search ........................ 385/88–94

[56] References Cited

U.S. PATENT DOCUMENTS

| 4,926,242 | 5/1990 | Itoh et al. | 357/81 |
| 5,311,610 | 5/1994 | Ladany et al. | 385/92 |
| 5,631,987 | 5/1997 | Lasky et al. | 385/88 |
| 5,845,030 | 12/1998 | Sasaki et al. | 385/88 |
| 5,845,031 | 12/1998 | Aoki | 385/92 |

FOREIGN PATENT DOCUMENTS

| 5-66330 | 3/1993 | Japan |
| 08195528 | 7/1996 | Japan |

*Primary Examiner*—Rodney Bovernick
*Assistant Examiner*—Ellen E. Kim
*Attorney, Agent, or Firm*—Pillsbury Madison & Sutro Intellectual Property Group

[57] ABSTRACT

A light emitting unit including a light emitting device of a light emitting module for optical communication is constituted by a laser diode for emitting communication light, a sub-mount having a good thermal conductivity and holding the laser diode on its upper surface, a heat sink for removing the heat generated by the laser diode, a photodiode for monitoring a light output from the laser diode, a laser driver IC which is thermally isolated from the laser diode, has an electric contact placed near the electric contact of the laser diode and connected thereto by wire bonding, and drives the laser diode, and a metal package for holding the heat sink, the photodiode, and the laser driver IC. A light emitting module for optical communication uses the light emitting unit.

17 Claims, 6 Drawing Sheets

ARRANGEMENT OF PELTIER COOLER 3

ARRANGEMENT OF OPTICAL SYSTEM UNIT

ARRANGEMENT OF RECEPTACLE UNIT

2~45 μm 33  32  31

ARRANGEMENT OF RECEPTACLE UNIT 32  31 z-AXIS ALIGNMENT MARGIN

UPPER VIEW AND CROSS SECTIONAL VIEW OF MODULE

LIGHT TRANSMITTING MODULE FOR OPTICAL COMMUNICATION AND LIGHT TRANSMITTING UNIT THEREOF

BACKGROUND OF THE INVENTION

1. Field of the Invention

The present invention relates to a compact light emitting module for optical communication incorporating a low-power driver and used as an optical transmitter for an ultra-high-speed optical emission system, and a light emitting unit used for the module.

2. Related Background Art

In light emitting modules for optical communication, laser diodes (LDs) are widely used as light emitting devices. In such a module, characteristics such as I-L characteristics indicating the relationship between the injection power to the LD and the output light power greatly depend on the temperature of the LD. To perform stable emission regardless of external temperature conditions, the temperature of the LD must be controlled to be constant. For an application demanding a wavelength stability of 1 mm or less, in particular, temperature control with a precision of 1° C. or less is required.

LDs generate heat during operation. Various light emitting modules having cooling elements for cooling the LDs to remove the heat generated by the LDs are known. For example, the light emitting module disclosed in Japanese Patent Laid-Open No. 8-195528 is available.

FIGS. 8A and 8B show the light emitting module disclosed in this reference. FIG. 8A is an upper view of the module without the package. FIG. 8B is a sectional view of the module. Referring to FIGS. 8A and 8B, an LD 104 is mounted on a Peltier cooler 112 serving as a cooling element through a Kovar base 128 and a copper laser carrier 130. Since temperature control is performed by using the Peltier cooler 112, a thermister 134 for measuring the temperature near the LD 104 is placed near the LD 104. With this arrangement, fine temperature control can be performed for the LD 104 to stabilize the emission characteristics.

SUMMARY OF THE INVENTION

This apparatus includes an external driver circuit for driving the LD. Such an independent driver circuit for driving the LD is used to improve the versatility of the light emitting module itself. However, to attain a high-speed response, the LD and driver circuit must be arranged as close to each other as possible. When the driver circuit is to be incorporated in the module, since the driver circuit generates a much larger quantity of heat than the LD, a problem is posed in ensuring the temperature stability of the LD.

It is an object of the present invention to provide a light emitting module incorporating a driver which can realize both high-speed response characteristics and temperature stability, and a light emitting unit used therefor.

In order to achieve the above object, according to the present invention, there is provided a light emitting unit including a light emitting device of a light emitting module for optical communication, comprising a metal package, a laser diode for emitting communication light, a sub-mount having a good thermal conductivity and holding the laser diode on an upper surface thereof, a heat sink for holding the sub-mount on the metal package and removing heat generated by the laser diode by conducting the heat to the metal package, a photodiode for monitoring a light output from the laser diode placed on the metal package, and a laser driver IC for driving the laser diode, the laser driver IC being placed on the metal package to be isolated from the heat sink and having an electric contact placed near an electric contact of the laser diode, and the electric contacts being connected to each other by wire bonding.

With this arrangement, since the LD and the LD driver IC are thermally isolated from each other and are placed nearby, they can be connected at the shortest distance by wire boding to ensure high-speed response characteristics. In addition, since the heat sink holds only the LD, the temperature can be accurately and easily controlled without giving any consideration to the heat generated by the LD driver IC which generates a large quantity of heat. The emission characteristics of the LD can therefore be stabilized.

Since the thermal expansion coefficients of the sub-mount, the heat sink, and the metal package are made equal to each other, positional shifts due to thermal expansion of the respective components can be suppressed, thus preventing optical axis misalignment.

A Peltier cooler is preferably used as the heat sink.

A light emitting module for optical communication according to the present invention includes this light emitting unit, an optical system unit which is constituted by a lens for guiding light emitted from the light emitting unit to a communication optical fiber, a lens holder for holding the lens, and a sleeve for holding a ferrule to which the communication optical fiber is fixed, and which optical system unit is fixed to the metal package, and a resin receptacle unit which is placed between the light emitting unit and the optical system unit to surround the optical system unit without touching, and which is fixed to the metal package.

With this structure, the optical system unit and the receptacle unit have certain backlash therebetween. The optical system unit and the light emitting unit need only be aligned once, and the influences of thermal deformation and the like of the receptacle unit can be suppressed.

In addition, the lens supporting portion of the lens holder is preferably thin and protrudes toward the laser diode. The two side portions of that portion of the sub-mount, on which the laser diode is mounted preferably protrude toward the optical system unit side, and the protruding portion of the lens holder is preferably held between the two side portions.

According to this arrangement, even if the laser diode is placed at a position where it can be connected to the LD driver IC at the shortest distance by wire bonding, the lens and the laser diode can be aligned at a desired distance.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 2A and 2B are views showing a light emitting unit portion in the embodiment in FIG. 1, in which FIG. 2A is an upper view of this portion, and FIG. 2B is a sectional view of the portion;

DESCRIPTION OF THE PREFERRED EMBODIMENTS

Figure 1:
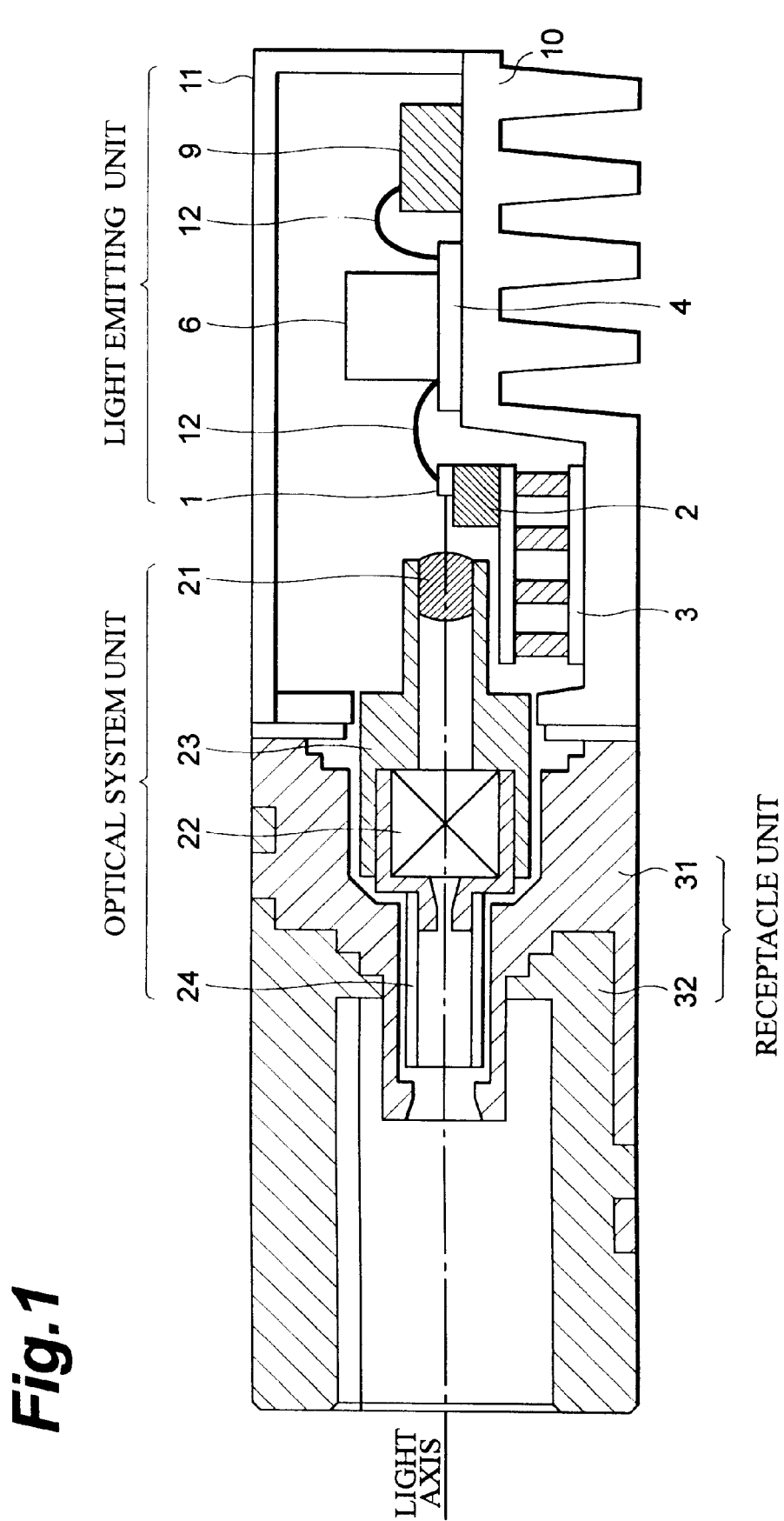
FIG. 1 is a sectional view showing a light emitting module for optical communication according to an embodiment of the present invention.

A preferred embodiment of the present invention will be described below with reference to the accompanying drawings. To facilitate the comprehension of the explanation, the same reference numerals denote the same parts, where possible, throughout the drawings, and a repetitive description will be avoided. Note that the shapes and sizes of some of the constituent elements in the drawings are emphasized for the sake of descriptive convenience, and do not coincide with the actual shapes and sizes.

Figure 2A:
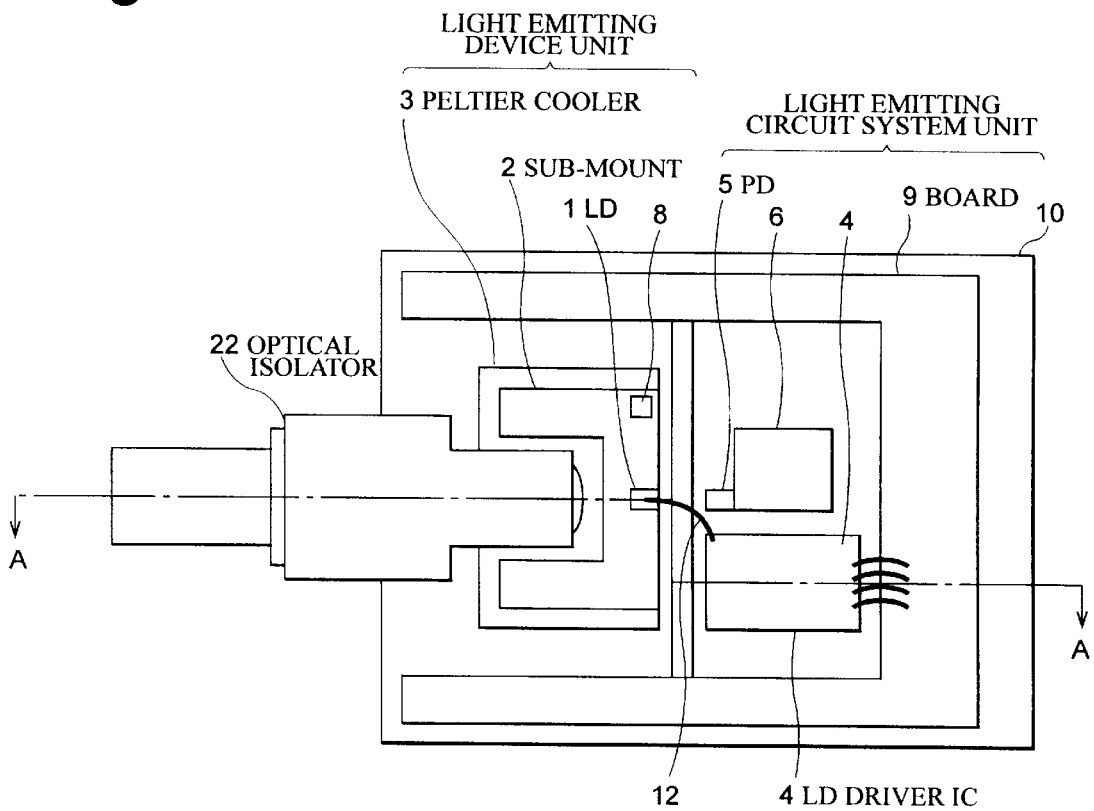
Figure 2B:
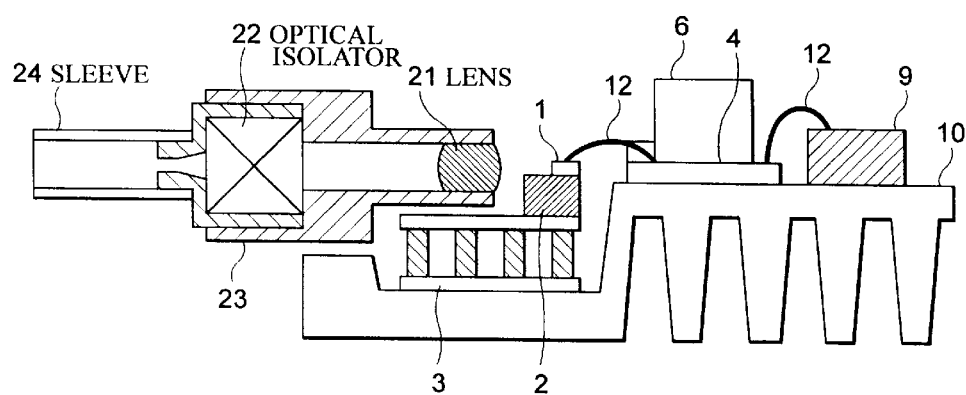

FIGS. 1, 2A, and 2B show the arrangement of a light emitting module for optical communication according to an embodiment of the present invention. FIG. 1 is a sectional view of the overall module when viewed from one side. For the sake of descriptive convenience, however, some constituent elements which are not actually on the same cross section are shown together (the contents of which will be described later). FIGS. 2A and 2B show the arrangements of the light emitting unit and optical system unit portions of this module. FIG. 2A is a layout drawing showing the arrangements of the units when viewed from the above. FIG. 2B is a sectional view showing the arrangements of these portions.

As shown in FIG. 1, this module is constituted by three units, i.e., a light emitting unit, an optical system unit, and a receptacle unit.

Of these units, the light emitting unit is constituted by an LD 1 serving as a light emitting device, a sub-mount 2 on which the LD 1 is mounted, a thermister 8 (not shown in FIGS. 1 and 2B) for measuring the temperature near the LD 1, a Peltier cooler 3 for cooling the LD 1 (the portion constituted by these components will be referred to as a "light emitting device unit" hereinafter), an LD driver IC 4 for driving the LD 1 to control the emission of light, a photodiode (PD) 5 for monitoring the emission of light from the LD 1, a sub-carrier 6 on which the PD 5 is mounted, a board 9 having inlaid metallization, and a metal package 10 used as a heat sink and a radiation fin (the portion constituted by these components will be referred to as a "light emitting circuit system unit" hereinafter). An outer case 11 is mounted on the light emitting unit portion.

The optical system unit is constituted by a lens 21, an optical isolator 22, a lens holder 23, and a sleeve 24. The emission surface of the LD 1 is opposed to the lens 21 such that the optical axis of the unit agrees with the optical axis of light emitted from the LD 1.

The receptacle unit is constituted by a sleeve insertion case 31 made of a resin and a resin adaptor portion 32. The sub-mount 2 surrounding the optical system unit is mounted on the Peltier cooler 3. That portion of the sub-mount 2, which is located on the optical system unit side is open, whereas those portions along the remaining three sides, i.e., the two side portions, protrude toward the optical system unit side. The LD 1 is mounted on that rear end portion of the sub-mount 2, which is remote from the optical system unit. With this structure, the lens 21 of the optical system unit is placed between the two side portions of the sub-mount 2 in front of the emission surface of the LD 1. The PD 5 is mounted on the sub-carrier 6 and directly placed on the metal package 10 behind the LD 1 (i.e., on the opposite side to the optical system unit), together with the LD driver IC 4. The LD 1 and the LD driver IC 4 are directly connected to each other with bonding wires 12, and so are the LD driver IC 4 and the metallized interconnections on the board 9.

As the metal package 10, a powder molded product which can be formed at a low cost with a high dimensional precision is preferably used. Since powder molding allows an arbitrary shape, a radiation fin can be easily formed. The heat generated by the LD driver IC 4 and the like can therefore be removed efficiently. This structure is also suited to the conductivity of the heat absorbed by the Peltier cooler 3. In addition, the heat generating portions such as the LD driver IC 4 can be isolated from the LD 1, and hence the Peltier cooler 3 is required to perform temperature control for only the LD 1. For this reason, the size of the Peltier cooler 3 can be reduced, and the power consumption can be reduced. Furthermore, by using Cu/W (copper/tungsten) as a material, a reduction in thermal resistance and adjustment of thermal expansion coefficients can be attained (this will be described in detail later).

A powder molded product is also preferably used as the sub-carrier 6 on which the PD 5 is mounted. The PD 5 must be positioned to oppose the LD 1 at a predetermined angle. With the use of powder molding, the mount surface of the sub-carrier 6 can easily have a tilt.

The Peltier cooler 3 is required to perform temperature control for the LD 1. If, however, cooling need not be performed specifically, the Peltier cooler 3 may be replaced with a Cu/W board having the same thickness as that of the Peltier cooler 3.

The optical system unit incorporates the lens 21, the optical isolator 22, the lens holder 23 constituted by a part for fixing the lens 21 and a part serving as a stopper for a ferrule, and the sleeve 24. This structure allows alignment with the LD 1 while the optical fiber ferrule is inserted in the sleeve 24, and hence greatly facilitates the alignment process. In a short-distance system or the like which ensures suppression of reflection of light to a high degree as a whole, the optical isolator 22 is not required. In this case, therefore, the system may have a structure without the optical isolator 22.

The LD driver IC 4 may be mounted on the metal package 10 or the board 9. In this case, the LD driver IC 4 is directly mounted on the metal package 10 to improve the heat conductivity. If the ground potential is not desirable as the board potential of the LD driver IC 4, the LD driver IC 4 may be mounted on the metal package 10 through, for example, an AlN (aluminum nitride) board instead of being directly mounted thereon. The LD driver IC 4 and the LD 1 are arranged nearby with their bonding surfaces being located at almost the same level so as to be directly connected to each other at the shortest distance through the bonding wires 12. This distance is preferably set to 2.5 mm or less. With a distance of 2.5mm or less, ultra-high speed characteristics corresponding to about 10 Gbits/s can be ensured. The inductance between these components can therefore be reduced to realize high-speed operation. The distance between the positions on the metal package 10 at which the LD driver IC 4 and the LD 1 are mounted is larger than the distance between them, and hence they are thermally isolated from each other. The influences of the heat generated by the LD driver IC 4 on the LD 1 can be suppressed.

To allow the LD 1 to operate with high precision, temperature control must be performed with a precision of 1° C. or less. According to the arrangement of this module, since the influences of the heat generated by the LD driver IC 4 can be suppressed, and the Peltier cooler 3 is dedicated to cooling of the LD 1, fine temperature control can be performed. The LD 1 can therefore operate stably.

Figure 3:
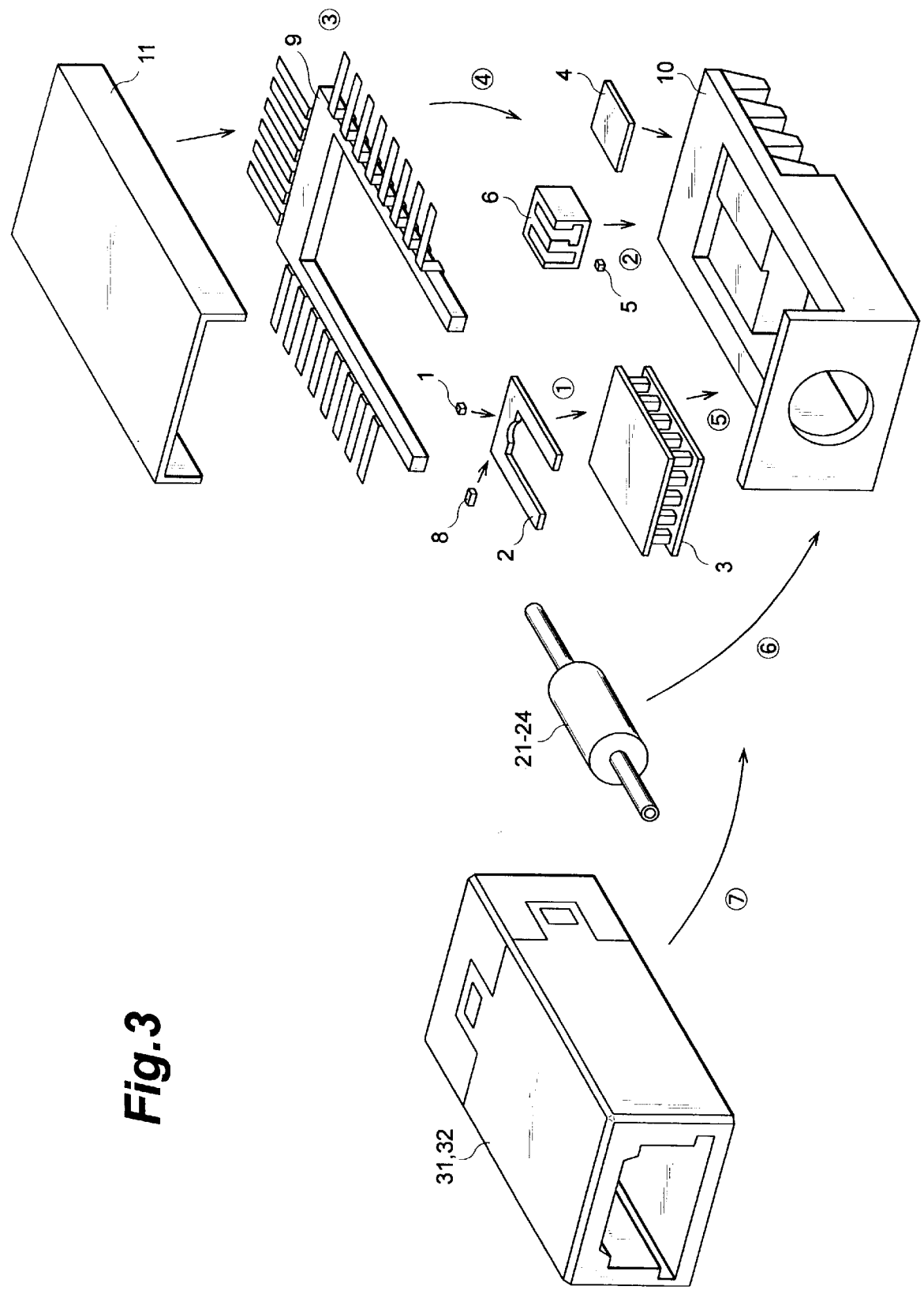
FIG. 3 is an exploded view showing a procedure for assembling the embodiment in FIG. 1.

A procedure for assembling the light emitting module for optical communication according to the present invention will be described next with reference to FIG. 3.

① The LD 1 and the thermister 8 are mounted on the sub-mount 2. The resultant structure is mounted on the Peltier cooler 3 to assemble a light emitting device unit.

② The PD 5 is fixed on the sub-carrier 6 by die bonding and electrically connected to the metallized interconnection portion of the sub-carrier 6 by wire bonding.

③ Passive elements such as capacitors (not shown) are mounted on the board 9.

④ The LD driver IC 4, the sub-carrier 6, and the board 9 are mounted on the metal package 10 to assemble a light emitting circuit system unit.

⑤ After the Peltier cooler 3 is soldered to the metal package 10, wiring is performed, and the resultant structure is covered with the outer case 11, thereby assembling a light emitting unit.

⑥ The two units, i.e., the light emitting unit and the optical system unit (21, 22, 23, 24), are aligned with each other and fixed with a resin.

⑦ A receptacle unit (31, 32) is placed on the sleeve portions of the aligned/fixed units. The resultant structure is mounted on the metal package 10 to finish the light emitting module for optical communication.

The characteristic features of the light emitting module for optical communication according to the present invention will be described in detail below.

(First Characteristic Feature)

The first characteristic feature is that the thermal expansion coefficient of the metal package is made equal to that of the Peltier cooler to prevent misalignment of their optical axes so as to realize a high-precision light emitting module.

According to the present invention, the LD 1 and the optical system unit are respectively mounted on the Peltier cooler 3 and the metal package 10. The difference in thermal expansion coefficient between these components may cause misalignment of the optical axes.

Figure 4:
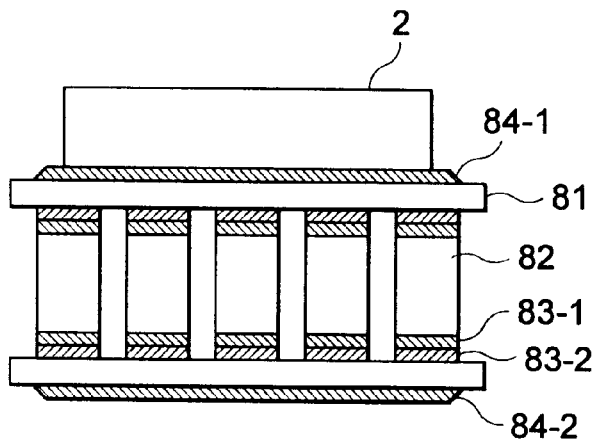
FIG. 4 is a sectional view showing the arrangement of a Peltier cooler 3 in the embodiment in FIG. 1.

In this embodiment, however, the thermal expansion coefficient of the Peltier cooler 3 is made equal to that of the LD 1 and the sub-mount 2 to improve the heat absorbing efficiency of the cooler 3. In addition, an AlN board is used as a ceramic board 81 of the Peltier cooler 3 to improve the reliability. Furthermore, as shown in FIG. 4, a Ni metallized layer 83-1 and a Cu metallized layer 83-2 are used as a metallized layer 83 between the ceramic board 81 and a Peltier element 82. Reference numeral 84-1 denotes solder 1 used to mount the ceramic board 81 to the sub-mount 2; and 84-2, solder 2 used for the other ceramic board 81.

Table 1 shows the thermal expansion coefficients of the respective components of this arrangement. Note that "(x2)" indicates the presence of two identical members, one of which has undergone no thermal expansion because of temperature control.

TABLE 1

(Thermal Expansion Coefficients of Components)

| Component | Material | Thickness L [mm] | Thermal Expansion Coefficient a [$10^{-5}$/K] | a × L [$10^{-6}$ mm/K] |
|---|---|---|---|---|
| Peltier cooler | AlN board | 0.3 (×2) | 4.5 | 1.57 |
| | Cu metallized layer | 0.03 (×2) | 17 | 0.51 |
| | Ni metallized layer | 0.005 (×2) | 13.3 | 0.067 |
| | Peltier cooler | 0.9 | 7.5 | 6.75 |
| | solder 1 | 0.04 | 23 | 0.92 |
| | solder 2 | 0.04 | 27 | 1.08 |
| Sub-Mount | | 1.0 | 5 | -(temperature control) |
| Solder 1 | | 0.004 | 23 | -(temperature control) |
| Total | | 2.25 | | 10.90 |
| Average Thermal Expansion Coefficient | | | 4.8 | |

As is obvious from this table, if a metal package is formed by using a typical Cu/W material having a thermal expansion coefficient of $1 \times 10^{-5}$/K as in the prior art, the difference between the thermal expansion coefficient of the Peltier cooler and the average thermal expansion coefficient becomes $5.2 \times 10^{-6}$/K. This means that the optical system unit mounted on the metal package undergoes a positional shift at a rate of $5.2 \times 10^{-6}$/K with a change in temperature. In this embodiment, since the distance from the radiating surface of the Peltier cooler to the emission portion of the LD is about 3 mm, the rate of positional shift with a change in temperature is $1.5 \times 10^{-2}$ μm/K. That is, a positional shift of about 0.45 μm occurs with a temperature change of 30° C. This value is large in consideration of the alignment tolerance between a single-mode optical fiber and an LD (in general, a positional shift must be suppressed to ±0.5 μm or less to suppress any change in optical coupling efficiency to ±1 dB or less). The positional shift caused by the difference in thermal expansion coefficient must be further reduced.

This embodiment therefore uses a method of changing the mixing ratio of Cu/W to make the thermal expansion coefficient equal to the average thermal expansion coefficient, i.e., $4.8 \times 10^{-6}$/K. With this method, the thermal expansion coefficients of the LD, the sub-mount, and the Peltier cooler are made equal to each other while a high heat removing efficiency is maintained, thereby preventing optical axis misalignment due to a change in temperature. In addition, by setting all the thermal expansion coefficients of the LD, the sub-mount, the Peltier cooler, and the metal package to the same value, an improvement in reliability is attained. The above thermal expansion coefficients correspond to Table 1. If materials and components different from those in Table 1 are used, different thermal expansion coefficients are set. In this case, Cu/W is used as a power molding material. However, other materials can be used as long as they allow adjustment of thermal expansion coefficients.

(Second Characteristic Feature)

The second characteristic feature is that the alignment process is facilitated, and the LD and the LD driver IC are connected to each other by wire bonding.

To realize efficient optical coupling between the LD and the optical fiber by using a lens system, the LD must be placed near the lens (at a distance of 1 mm or less in general). For this purpose, a method of mounting the LD on that end portion of the Peltier cooler, which is located on the optical system unit side is preferably used because this method is simple and allows a margin for an alignment process. To obtain good electrical characteristics in connecting the LD driver IC and the LD, the interconnection distance between these components must be minimized. It is difficult to satisfy both the requirements in the prior art.

Figure 5:
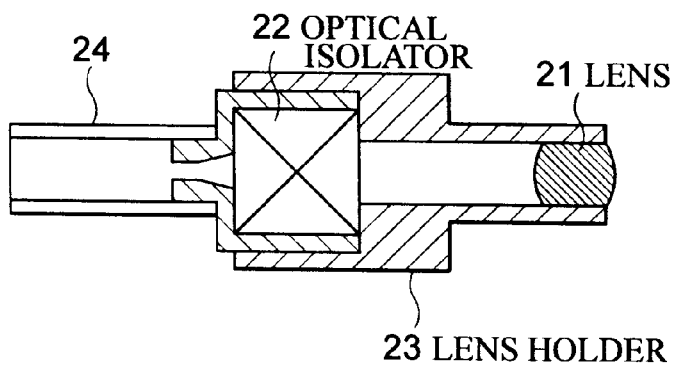
FIG. 5 is a sectional view showing the arrangement of an optical system unit in the embodiment in FIG. 1.

To solve this problem, the optical system unit in the present invention has the structure shown in FIG. 5. The lens holder 23 is constituted by two components, one of which is press-fitted in the sleeve 24 to also serve as a ferrule stopper. In addition, the press-fitting amount of the component is set to be small so as to prevent mechanical deformation of the ferrule. The optical isolator 22 is housed in this component. This component and the other component in which the lens 21 is fixed are integrated into the optical system unit. Although a conventional module generally uses a pigtail type optical system unit, this embodiment uses a receptacle type unit. This unit is inserted into the receptacle unit to finish the light emitting module for optical communication.

This optical system unit is characterized in that the position of the optical fiber is uniquely determined upon fitting of the ferrule and the sleeve because the sleeve 24 is an integral unit. If, therefore, lens is designed such that a light beam is incident within the effective area of the optical isolator 22, no positioning is required for the optical isolator 22. Since the optical system is integrated into a unit in this manner, the alignment process is facilitated. Furthermore, by positioning this unit with respect to the LD, alignment need only be performed once.

The lens holding portion of the lens holder 23 is thin and protrudes, and the sub-mount 2 covers the protruding portion of the lens holder 23. With this structure, as shown in FIGS. 1 and 2, the LD 1 can be placed on that end portion of the Peltier cooler 3, which is located on the LD driver IC 4 side. This allows the LD 1 and the LD driver IC 4 to be connected to each other at the shortest distance by wire bonding. In addition, the lens 21 and the LD 1 can be placed nearby.

Note that the lens 21 is placed above the Peltier cooler 3, and hence the alignment margin is small. However, in consideration of the mechanical tolerance of the optical system unit, the optical parts assembly precision, and variations in lens characteristics, variations in focal position on the LD 1 side can be suppressed within 100 to 200 $\mu$m. It therefore suffices if the alignment margin is set to about 200 $\mu$m. In this case, the thickness of the sub-mount 2 may be set to (alignment margin)+(thickness of lens holder 23)+(radius of lens 21)−(thickness up to emission portion of LD 1).

(Third Characteristic Feature)

The third characteristic feature is that high-precision transmission is realized by suppressing the influences of optical axis misalignment due to the deformation of the metal package and the resin receptacle upon thermal expansion.

The light emitting module for optical communication according to the present invention has a receptacle structure, as shown in FIG. 1. The ferrule portion of the optical fiber connector is guided by this receptacle unit (31, 32) to be inserted into the sleeve 24 of the optical system unit. For this reason, the receptacle unit must be positioned with respect to the optical system unit. The optical system unit is fixed to the metal package 10 after alignment. If, therefore, the receptacle unit and the optical system unit are mechanically and directly connected to each other, thermal deformation takes place due to the difference in thermal expansion coefficient between the resin as the material for the receptacle unit and the metal package, resulting in optical axis misalignment with respect to the LD 1. Since the thermal expansion coefficient of the resin is higher than that of the metal package, and the metal package and the receptacle unit are fixed to each other, a bimetal phenomenon tends to occur. The resultant thermal deformation cannot be neglected.

Figure 6:
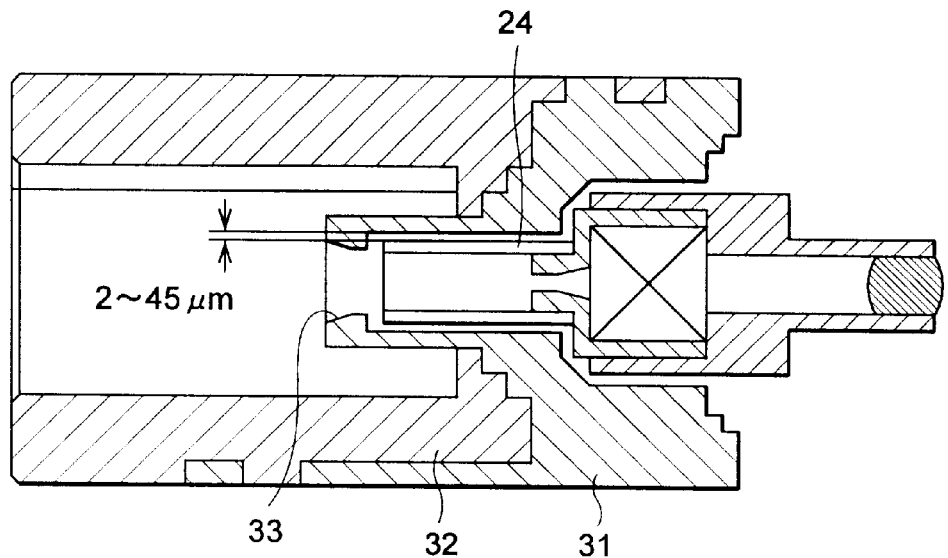
FIGS. 6 and 7 are sectional views for explaining the arrangement of a receptacle unit in the embodiment in FIG. 1.

FIG. 6 shows a receptacle unit having a structure that can solve this problem. As shown in FIG. 1 as well, the receptacle unit is constituted by the sleeve insertion case 31 made of a resin and the resin adaptor portion 32. A small gap is ensured between the sleeve insertion case 31 and the sleeve 24. The minimum gap is a value that can absorb deformation due to thermal expansion. The maximum gap is determined as an allowable value that allows the ferrule to be smoothly inserted into the sleeve 24. For example, this gap is preferably set to 2 to 45 $\mu$m.

Although the deformation arising from thermal expansion may be about 1 $\mu$m at most, even about half of this deformation produces a loss of −1 dB in optical coupling of the LD. This deformation cannot therefore be neglected. If the gap is set to at least about 2 $\mu$m, since the gap is larger than the above deformation amount, a satisfactory effect can be expected. If, however, the gap is excessively large, the positioning effect for the receptacle unit and the optical system unit is lost. In the worst case, the ferrule cannot be inserted. The ferrule is guided by a ferrule insertion side tapered portion 33 of the sleeve insertion case 31 to be inserted. The maximum margin of the inner diameter of this guide portion with respect to the diameter of the ferrule is ±45 $\mu$m. If, therefore, the maximum gap between the sleeve insertion case 31 and the sleeve 24 is set to 45 $\mu$m or less, the central positional shift between the ferrule insertion side tapered portion 33 and the inserted sleeve 24 becomes 45 $\mu$m or less. This allows the ferrule to be smoothly inserted into the sleeve 24 along the tapered portion.

(Fourth Characteristic Feature)

The fourth characteristic feature is that any positional shift of the optical system unit which is generated in the process of mounting the unit can be prevented.

When the optical system unit is to be mounted, alignment of three axes in two directions (x and y directions) perpendicular to the optical axis and in the optical axis direction is performed. The fixing positions of the optical system unit and the metal package become indeterminable to the extent corresponding to the alignment margin. In the x and y directions, the receptacle unit may be shifted at the position where the optical system unit is positioned, and the metal package is mounted. However, the receptacle unit and the metal package are bonded to a surface perpendicular to the z-axis, and hence no tolerance is allowed in the z direction.

Figure 7:
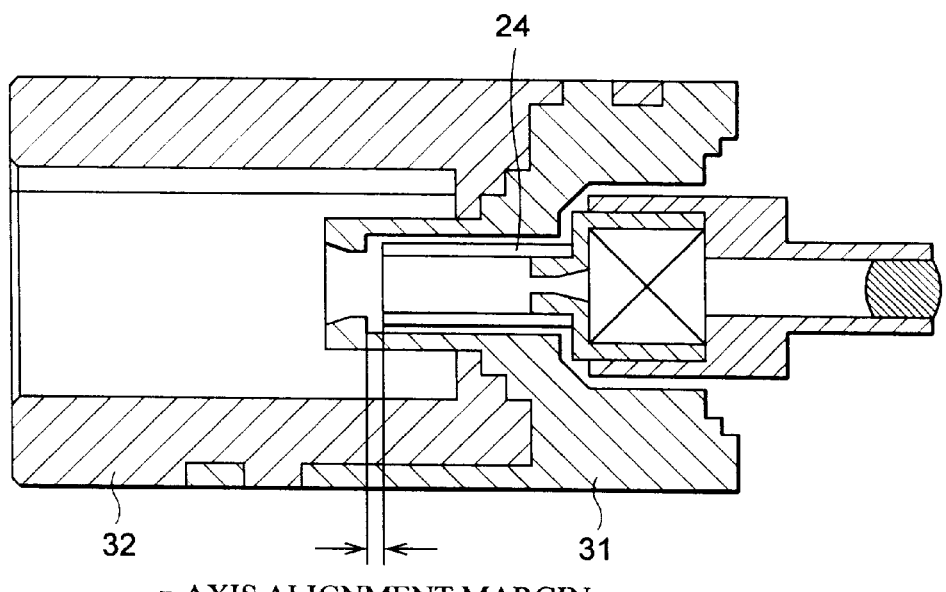
Figure 8A:
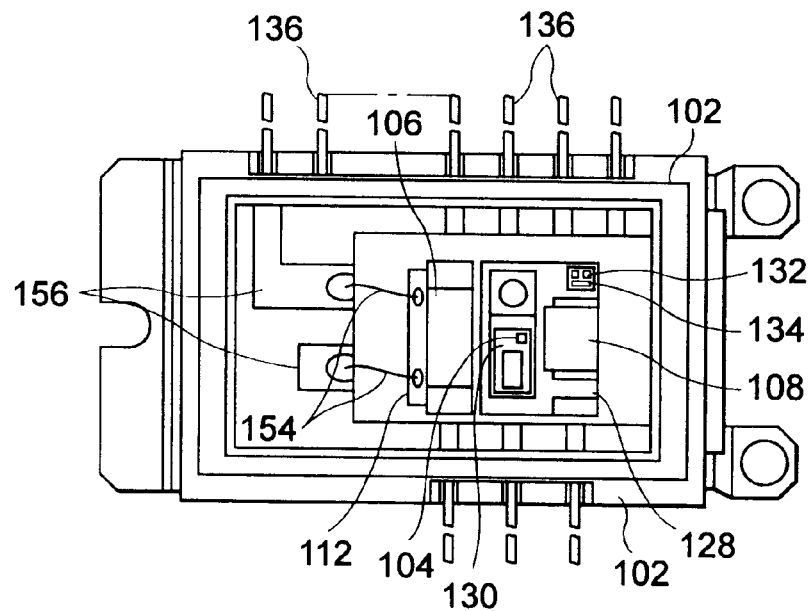
FIG. 8A is an upper view showing a conventional light emitting module for optical communication without a package.
Figure 8B:
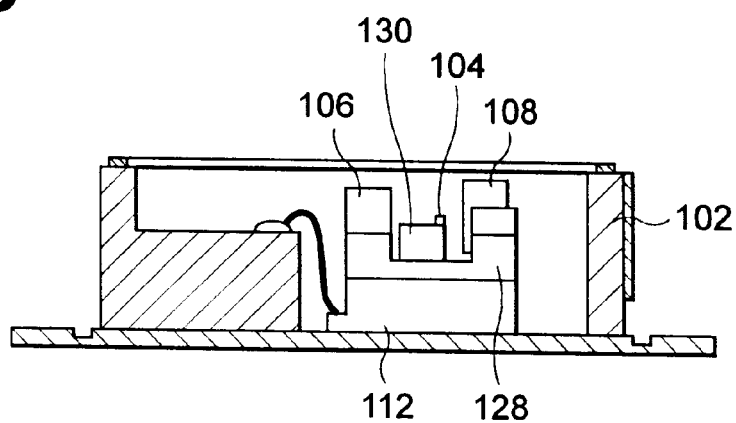
FIG. 8B is a sectional view of the module.

FIG. 7 shows a receptacle unit having a structure that can solve this problem. The sleeve insertion case 31 in which the sleeve 24 is inserted is formed to be relatively long so as to ensure a gap in the z direction as well. With this gap, the optical system unit in the z direction is not shifted.

As has been described above, the structure of the light emitting module for optical communication according to the present invention facilitates optical axis alignment, requiring only one optical axis alignment process. In addition, this structure can cope with optical axis misalignment due to thermal expansion. Furthermore, the LD and the LD driver IC can be directly connected to each other. Moreover, the structure can reduce shifts of fixing positions caused by an alignment process for reduction of variations in the focal point of the optical system unit. Therefore, a compact, high-speed, low-power-consumption, inexpensive light emitting module for optical communication can be realized.

As may be seen from the above description, the present invention can be variously modified. It is to be understood that such modifications fall within the spirit and scope of the invention, and any improvements obvious to those skilled in the art are incorporated in the appended claims.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A light emitting unit including a light emitting device of a light emitting module for optical communication, comprising:
   a metal package having a stepwise surface, said stepwise surface comprising a lower step and a higher step;
   a laser diode for emitting communication light;
   a sub-mount having a good thermal conductivity and holding said laser diode on an upper surface thereof;
   a heat sink for holding said sub-mount on said lower step of said metal package and removing heat generated by said laser diode by conducting the heat to said metal package;
   a photodiode for monitoring a light output from said laser diode, said photodiode placed on said higher step of said metal package;
   a laser driver IC for driving said laser diode, said laser driver IC being placed on said higher step of said metal package and having an electric contact placed near an electric contact of said laser diode; and
   a wire electrically connecting said electric contacts of said laser diode and said laser driver IC.

2. A unit according to claim 1, wherein said metal package comprises a radiation fin on a reverse surface of said higher step.

3. A unit according to claim 1, wherein said sub-mount, said heat sink, and said metal package is manufactured of AlN or Cu/W having a thermal expansion coefficient within (that of said laser diode)+$1 \times 10^{-5}$/K.

4. A unit according to claim 1, further comprising an AlN or Cu/W sub-carrier on which said photodiode is mounted.

5. A unit according to claim 1, wherein said heat sink is a Peltier cooler constituted by an AlN board, a Cu metallized layer, a Ni metallized layer, and a Peltier element.

6. A unit according to claim 5, wherein said metal package uses Cu/W whose mixing ratio is adjusted such that a thermal expansion coefficient becomes equal to an average thermal expansion coefficient of said Peltier cooler.

7. A light emitting module for optical communication comprising:
   said light emitting unit according to claim 1;
   an optical system unit which is constituted by a lens for guiding light emerging from said light emitting unit to a communication optical fiber, a lens holder for holding said lens, and a sleeve for holding a ferrule to which said communication optical fiber is fixed, and which optical system unit is fixed to said metal package; and
   a resin receptacle unit which is placed between said light emitting unit and said optical system unit to surround said optical system unit without touching, and which is fixed to said metal package.

8. A module according to claim 7, wherein a gap between said receptacle unit and a sleeve of said optical system unit falls within a range of 2 μm to 45 μm inclusive.

9. A module according to claim 7, wherein said optical system unit incorporates an optical isolator.

10. A module according to claim 7, wherein said optical system unit incorporates an optical isolator and is integrated therewith.

11. A module according to claim 7, wherein a lens holding portion of said lens holder is thin and protrudes toward said laser diode, and two side portions of a portion of said sub-mount on which said laser diode is mounted protrude toward said optical system unit, said lens holder having a protruding portion held between the side portions.

12. A module according to claim 11, wherein a thickness of said sub-mount is set to a sum of (a thickness of said lens holder)+(a radius of said lens)+(a thickness up to an emission portion of a semiconductor laser) and an alignment margin of about 200 μm.

13. A light emitting module for optical communication comprising:
   a light emitting unit comprising:
      a metal package;
      a laser diode for emitting communication light;
      a sub-mount having a good thermal conductivity and holding said laser diode on an upper surface thereof;
      a heat sink for holding said sub-mount on said metal package and removing heat generated by said laser diode by conducting the heat to said metal package;
      a photodiode for monitoring a light output from said laser diode placed on said metal package;
      a laser driver IC for driving said laser diode, said laser driver IC being placed on said metal package to be isolated from said heat sink and having an electric contact placed near an electric contact of said laser diode, and the electric contacts being connected to each other by wire bonding;
   an optical system unit which is constituted by a lens for guiding light emerging from said light emitting unit to a communication optical fiber, a lens holder for holding said lens, and a sleeve for holding a ferrule to which said communication optical fiber is fixed, and which optical system unit is fixed to said metal package; and
   a resin receptacle unit which is placed between said light emitting unit and said optical system unit to surround said optical system unit without touching, and which is fixed to said metal package.

14. A light emitting module according to claim 13, wherein a gap between said receptacle unit and a sleeve of said optical system unit falls within a range of 2 μm to 45 μm inclusive.

15. A module according to claim 13, wherein said optical system unit incorporates an optical isolator and is integrated therewith.

16. A module according to claim 13, wherein a lens holding portion of said lens holder is thin and protrudes toward said laser diode, and two side portions of a portion of said sub-mount on which said laser diode is mounted protrude toward said optical system unit, said lens holder having a protruding portion held between the side portions.

17. A module according to claim 16, wherein a thickness of said sub-mount is set to a sum of (a thickness of said lens holder)+(a radius of said lens)+(a thickness up to an emission portion of a semiconductor laser) and an alignment margin of about 200 μm.

* * * * *